(12) United States Patent
Cheng et al.

(10) Patent No.: US 12,283,791 B2
(45) Date of Patent: Apr. 22, 2025

(54) SEMICONDUCTOR LASER CHIP AND PREPARATION METHOD THEREFOR

(71) Applicant: YLX INCORPORATED, Shenzhen (CN)

(72) Inventors: Chao-Chen Cheng, Shenzhen (CN); Anh Chuong Tran, Shenzhen (CN)

(73) Assignee: YLX INCORPORATED, Shenzhen (CN)

( * ) Notice: Subject to any disclaimer, the term of this patent is extended or adjusted under 35 U.S.C. 154(b) by 936 days.

(21) Appl. No.: 17/296,142

(22) PCT Filed: Oct. 16, 2019

(86) PCT No.: PCT/CN2019/111425
§ 371 (c)(1),
(2) Date: Oct. 22, 2021

(87) PCT Pub. No.: WO2020/103613
PCT Pub. Date: May 28, 2020

(65) Prior Publication Data
US 2022/0059986 A1   Feb. 24, 2022

(30) Foreign Application Priority Data

Nov. 21, 2018   (CN) .......................... 201811393166.9

(51) Int. Cl.
*H01S 5/024*  (2006.01)
*H01S 5/02*  (2006.01)
(Continued)

(52) U.S. Cl.
CPC ........ *H01S 5/02469* (2013.01); *H01S 5/0215* (2013.01); *H01S 5/022* (2013.01);
(Continued)

(58) Field of Classification Search
CPC .... H01S 5/0212; H01S 5/0215; H01S 5/0216; H01S 5/02469
See application file for complete search history.

(56) References Cited

U.S. PATENT DOCUMENTS 10,693,279 B1 *  6/2020  McLaurin ............. H01S 5/3202
2004/0191942 A1 *  9/2004  Kawakami ............. B82Y 20/00
                                                       438/33
(Continued)

FOREIGN PATENT DOCUMENTS

CN      101276763 A    10/2008
CN      107408791 A    11/2017
(Continued)

*Primary Examiner* — Michael Carter
(74) *Attorney, Agent, or Firm* — ScienBiziP, P.C.

(57) ABSTRACT

A semiconductor laser chip and a preparation method therefor, the method comprising: providing an epitaxial wafer (100), the epitaxial wafer (100) comprising a plurality of resonant cavities (110) arranged in parallel; providing a heat sink substrate (200); attaching the epitaxial wafer (100) to the heat sink substrate (200) so as to form a first chip semi-finished product (10); performing first division on the first chip semi-finished product (10) in the direction perpendicular to the resonant cavities (110) so as to divide the first chip semi-finished product (10) into a plurality of second chip semi-finished products (20); and performing second division on the second chip semi-finished products (20) in the direction parallel to the resonant cavities (110) so as to divide the second chip semi-finished products (20) into a plurality of semiconductor laser chips (30) such that the semiconductor laser chips (30) comprise at least one laser bar.

9 Claims, 5 Drawing Sheets

(51) Int. Cl.
  *H01S 5/022*    (2021.01)
  *H01S 5/0236*   (2021.01)
  *H01S 5/026*    (2006.01)
  *H01S 5/10*     (2021.01)

(52) U.S. Cl.
  CPC .......... *H01S 5/0236* (2021.01); *H01S 5/0265* (2013.01); *H01S 5/1021* (2013.01)

(56) References Cited

U.S. PATENT DOCUMENTS

| | | | |
|---|---|---|---|
| 2008/0242003 A1 | 10/2008 | How et al. | |
| 2012/0314398 A1* | 12/2012 | Raring | H01S 5/34333 |
| | | | 362/230 |
| 2016/0240999 A1 | 8/2016 | Barbarossa et al. | |
| 2016/0285238 A1* | 9/2016 | Morita | H01S 5/0202 |
| 2018/0287338 A1* | 10/2018 | Tanisaka | H01S 5/0217 |
| 2021/0281050 A1* | 9/2021 | Kadowaki | H01S 5/34346 |

FOREIGN PATENT DOCUMENTS

| | | |
|---|---|---|
| CN | 108666869 A | 10/2018 |
| JP | 2014183120 A | 9/2014 |

\* cited by examiner

SEMICONDUCTOR LASER CHIP AND PREPARATION METHOD THEREFOR

TECHNICAL FIELD

The present disclosure relates to the field of lasers, and in particular, to a semiconductor laser chip and a preparation method thereof.

BACKGROUND

The all-solid-state laser by a semiconductor laser-pumped is a new type of laser that appeared in the late 1980s. Its overall efficiency is at least 10 times higher than that of lamp pumping. Due to the reduced heat load per unit output, higher power can be obtained. The system life and reliability are about 100 times that of flashlamp pumping systems. Therefore, semiconductor laser pumping technology has injected new vitality and vigor into solid-state lasers, so that solid-state lasers have the dual characteristics of solid-state lasers and semiconductor laser chips. Its emergence and gradual maturity are a revolution in the solid-state lasers, and also a development direction of the solid-state lasers. Moreover, it has penetrated into various disciplines, such as laser information storage and processing, laser material processing, laser medicine and biology, laser communication, laser printing, laser spectroscopy, laser chemistry, laser separation isotope, laser nuclear fusion, laser projection display, laser detection and measurement, and military laser technology have greatly promoted technological progress and unprecedented development in these fields.

The semiconductor linear array lasers used for side pumping sources on the existing market are often composed of four or more independent laser chips. At present, the preparation process of such semiconductor lasers is first to cut and spray the entire laser chip. An epitaxial wafer is cut into a plurality of laser bars, and each of the laser bars is coated with a high reflective film on a back cavity surface and an antireflection film on a front cavity surface of a cavity. Then, the laser bars are welded on a heat sink substrate with the P side facing down and spaced apart from each other. For a preparation of some high-power lasers, it is necessary to weld a plurality of laser bars on the heat sink substrate to ensure the output power of the high-power semiconductor laser. The existing manufacturing method cannot achieve simultaneous welding of a plurality of laser bars on the heat sink substrate. The conventional process is to weld one laser bar at a time and fix the laser bars on the heat sink substrate by welding for many times. Obviously, this process cannot meet the requirements of the production efficiency of high-power semiconductor lasers and ultra-high-power semiconductor lasers. Therefore, a new method for preparing semiconductor laser chips is urgently needed.

SUMMARY

The present disclosure provides a semiconductor laser chip and a preparation method thereof, which can solve the problems of complicated preparation process and high cost of the semiconductor laser chip in the prior art.

A technical solution adopted in the present disclosure is to provide a preparation method for a semiconductor laser chip. The method includes: S11: providing an epitaxial wafer, the epitaxial wafer including a plurality of resonant cavities arranged in parallel; S12: providing a heat sink substrate including a first surface and a second surface that are oppositely disposed; S13: bonding the epitaxial wafer to the first surface of the heat sink substrate to form a first chip semi-finished product; S14: performing a first division on the first chip semi-finished product in a direction perpendicular to the resonant cavities, to divide the first chip semi-finished product into a plurality of second chip semi-finished products; S15: performing a second division on the second chip semi-finished products in a direction parallel to the resonant cavities to divide the second chip semi-finished products into a plurality of semiconductor laser chips, so that each of the semiconductor laser chips includes at least one laser bar.

According to an embodiment of the present disclosure, the step S14 includes performing a first cutting on the heat sink substrate of the first chip semi-finished product in the direction perpendicular to the resonance cavities to form first cutting slits.

According to an embodiment of the present disclosure, the step S14 further includes performing a first cleavage on the epitaxial wafer of the first chip semi-finished product along a direction of the first cutting slits to form a plurality of cleavage planes of the second chip semi-finished products.

According to an embodiment of the present disclosure, the step S14 includes the cleavage planes of the second chip semi-finished products to form resonant cavities, wherein an antireflection film is coated on front cavity surfaces of the resonant cavities, and a reflective film is coated on back cavity surfaces of the resonant cavities.

According to an embodiment of the present disclosure, a depth of each of the first cutting slits is greater than or equal to a thickness of the heat sink substrate.

According to an embodiment of the present disclosure, the step S15 includes performing the second division on the epitaxial wafer of the second chip semi-finished products in the direction parallel to the resonant cavities to form second cutting slits.

According to an embodiment of the present disclosure, the step S15 includes cutting the heat sink substrate of the second chip semi-finished products along a direction of the second cutting slits to form the plurality of semiconductor laser chips.

According to an embodiment of the present disclosure, a depth of each of the second cutting slits is greater than or equal to a thickness of the epitaxial wafer, and a width of each of the second cutting slits is less than 20 μm.

According to an embodiment of the present disclosure, the step S15 includes coating cavity surfaces of the resonant cavities of the second chip semi-finished products to form resonant cavities, wherein an antireflection film is coated on front cavity surfaces of the resonant cavities, and a reflective film is coated on back cavity surfaces of the resonant cavities.

According to an embodiment of the present disclosure, the step S13 includes thinning and polishing a side of the epitaxial wafer away from the heat sink substrate.

According to an embodiment of the present disclosure, the heat sink substrate is one of metal substrate, ceramic substrate, or sapphire substrate.

In order to solve the above technical problems, another technical solution adopted in the present disclosure is to provide a semiconductor laser chip device, which includes a heat sink substrate; and at least one laser bar, the laser bar including a resonant cavity; in a direction parallel to the resonant cavity, a length of the heat sink substrate is less than a length of the laser bar; in a direction perpendicular to the resonant cavity, a length of the heat sink substrate is greater than a length of the laser bar.

The beneficial effects of the present disclosure are: different from the prior art, the present disclosure provides a semiconductor laser chip and a preparation method thereof, by first bonding the epitaxial wafer and the heat sink substrate to form the first chip semi-finished product, and then same may be divided according to specific needs, thus semiconductor laser chips of different models and sizes can be obtained as needed, and further, by setting the cutting direction, width and depth, excellent semiconductor laser chips can be obtained.

BRIEF DESCRIPTION OF DRAWINGS

In order to illustrate the technical solutions more clearly in the embodiments of the present disclosure, the following will briefly introduce the drawings needed in the description of the embodiments. Obviously, the drawings in the following description are only some embodiments of the present disclosure. For those of ordinary skill in the art, without creative work, other drawings can be obtained based on these drawings, among which.

DESCRIPTION OF EMBODIMENTS

Figure 1:
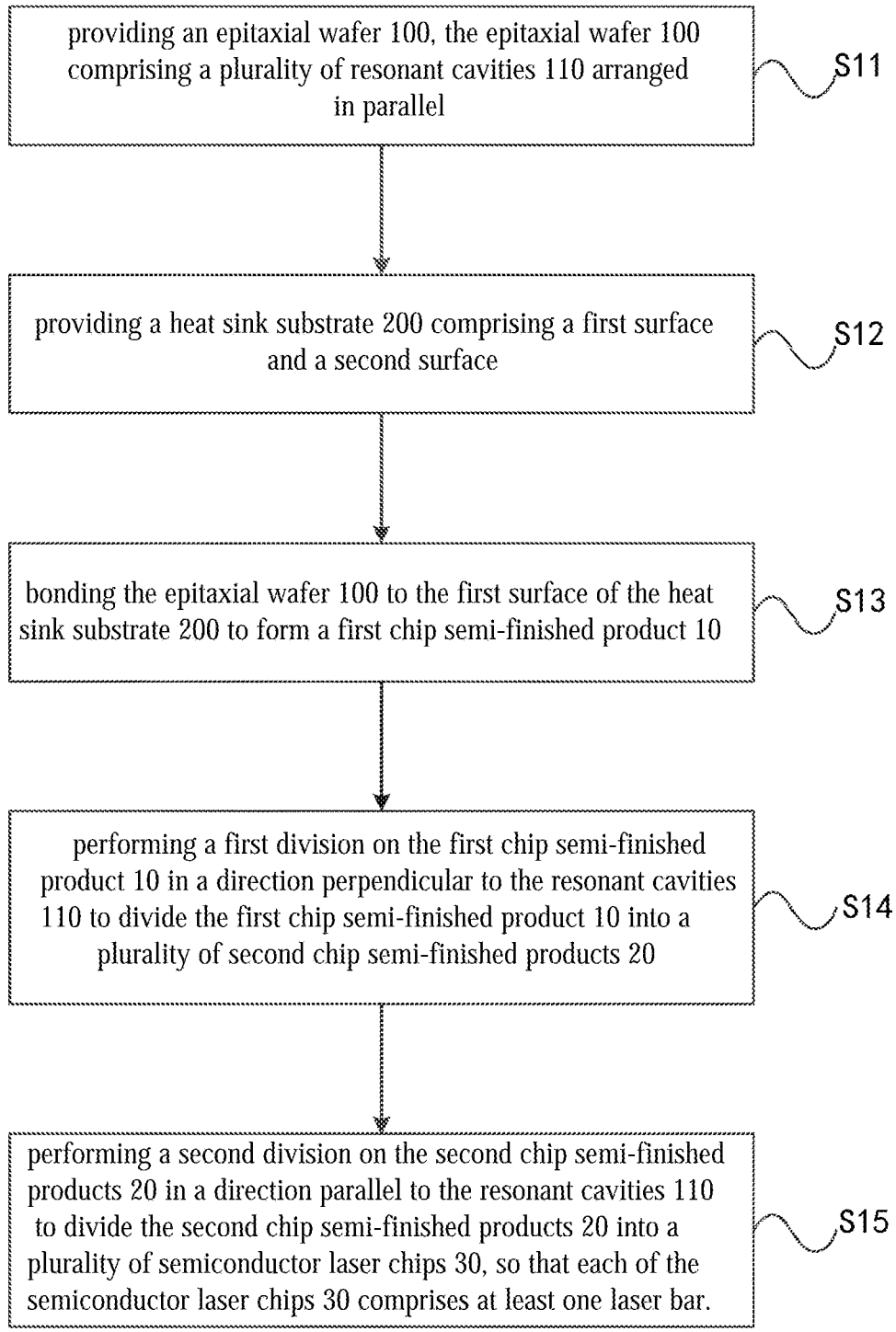
FIG. 1 is a schematic flowchart of a preparation method for a semiconductor laser chip according to the present disclosure.

The technical solutions in the embodiments of the present disclosure will be described clearly and completely with reference to the drawings in the embodiments of the present disclosure. Obviously, the described embodiments are only a part of the embodiments of the present disclosure, rather than all the embodiments. Based on the embodiments in the present disclosure, all other embodiments obtained by a person of ordinary skill in the art without creative work fall within the protection scope of the present disclosure.

It should be noted that if there is a directional indication (such as up, down, left, right, front, back . . . ) in the embodiments of the present disclosure, the directional indication is only used to explain the relative positional relationship, movement, etc. between the components in a specific posture (as shown in the drawings). If the specific posture changes, the directional indication will also change accordingly.

In addition, if there are descriptions related to "first", "second", etc. in the embodiments of the present disclosure, the descriptions of "first", "second", etc. are for descriptive purposes only, and cannot be understood as instructions or imply its relative importance or implicitly indicate the number of technical features indicated. Therefore, the features defined with "first", "second" may explicitly or implicitly include at least one of the features. In addition, the technical solutions between the various embodiments can be combined with each other, but it must be based on what can be achieved by a person of ordinary skill in the art. When the combination of technical solutions is contradictory or cannot be achieved, it should be considered that such a combination of technical solutions does not exist, nor is it within the scope of protection required by the present disclosure.

Please refer to FIG. 1. FIG. 1 is a schematic flowchart of a first embodiment of a preparation method of a semiconductor laser chip according to the present disclosure. The specific method includes the following steps.

In S11, an epitaxial wafer 100 is provided, and the epitaxial wafer 100 includes a plurality of resonant cavities 110 arranged in parallel.

Figure 2:
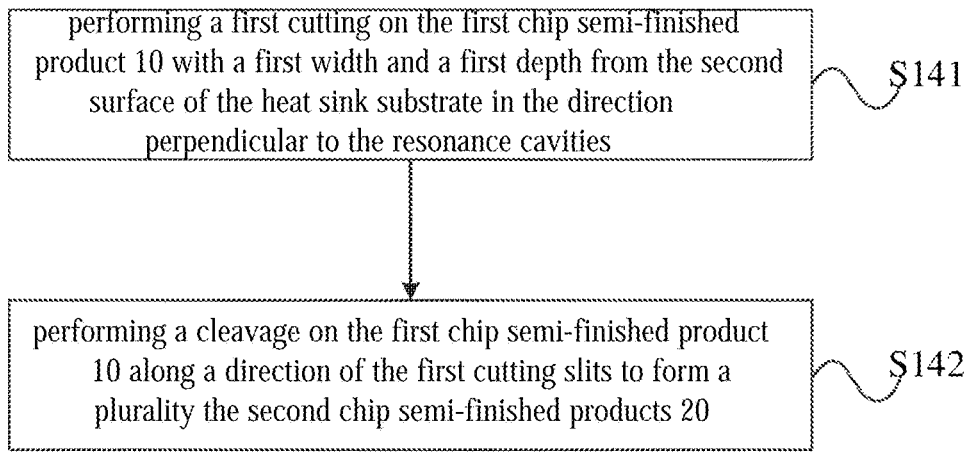
FIG. 2 is a specific schematic flowchart of S14 of the preparation method for the semiconductor laser chip according to the present disclosure.

Please refer to FIG. 1 and FIG. 2, the epitaxial wafer includes a substrate, and the substrate is used for epitaxial growth of various layers of laser materials thereon; the epitaxial wafer includes a buffer layer, the buffer layer is arranged on the substrate, and its purpose is to form a high-quality epitaxial surface, reduce the stress between the substrate and other material layers, and eliminate the propagation of substrate defects to other layers to facilitate the growth of other material layers; the epitaxial wafer includes a lower confinement layer, the lower confinement layer is arranged on the buffer layer, and its purpose is to limit the expansion of the optical field transverse mode to the buffer layer and the substrate, reduce the loss of light, and at the same time limit the diffusion of carriers, reduce hole leakage current and reduce the threshold current of the device and improve light efficiency; the epitaxial wafer includes a lower waveguide layer, which is arranged on the lower confinement layer, and its purpose is to strengthen the restriction of the optical field, reduce the far-field divergence angle of the beam, and improve the beam quality of the semiconductor laser chip device, and the low waveguide layer uses a small amount of doped material to reduce the light absorption loss; and the epitaxial wafer includes an active layer, the epitaxial wafer is arranged on the lower waveguide layer, and its function is to act as an active region of the laser, provide sufficient optical gain, and determine the lasing wavelength of the semiconductor laser chip device and the service life of the semiconductor laser chip device; the epitaxial wafer includes an upper waveguide layer, the upper waveguide layer is arranged on the active layer, its purpose is to strengthen the limitation of the optical field, reduce the far-field divergence angle of the beam, improve the beam quality of the semiconductor laser chip device, and the upper waveguide layer uses a small amount of doped material to reduce the light absorption loss; the epitaxial wafer includes a upper confinement layer, the upper confinement layer is arranged on the upper waveguide layer, its purpose is to limit the expansion of the optical field transverse mode to the buffer layer and the substrate, reduce the loss of light, and at the same time limit the diffusion of carriers, reduce the hole leakage current to reduce the threshold current of the semiconductor laser chip device and improve light efficiency; the epitaxial wafer includes a transition layer, the transition layer is arranged on the upper confinement layer, its purpose is to reduce the stress between the upper confinement layer and the electrode contact layer, and realize the transition from the upper confinement layer to the electrode contact layer. It can be understood that in a modified embodiment, when the adhesion between the confinement layer and the electrode layer material is good, no transition layer is required.

In a specific embodiment, the epitaxial wafer 100 further includes a resonant cavity 110. The resonant cavity 110 is formed by etching above the confinement layer, and a depth of the etching does not exceed the confinement layer, that is, a part of the waveguide layer and the confinement layer on both sides are etched away, leaving the unetched waveguide layer and confinement layer in the middle, to form the resonant cavity. The advantage of setting the resonant cavity is to form a certain gradient refractive distribution on a side of the epitaxial wafer, which has a certain restrictive effect on the lateral light. In addition, in some high-power lasers, the resonant cavity also serves as a filter for mode selection. The etching method, the etching depth, and the width of the resonant cavity are conventional technologies in the art, and will not be repeated here.

A material of each layer of the epitaxial wafer 100 may specifically be one or more of GaAs, AlGaAs, InAs, InGaAs, GaInP, GaInAsP, AlGaInP, GaN, GaInN, AlGaN, and AlGaInN.

In S12, a heat sink substrate 200 is provided, which includes a first surface and a second surface.

The heat sink substrate 200 in the present disclosure may be a metal substrate, which itself has good thermal conductivity and electrical conductivity. The heat sink substrate 200 including the first surface and the second surface that are arranged oppositely; or a double-layer thermally conductive substrate, which close to the first surface is a metal substrate layer, and close to the second surface is a heat dissipation substrate layer. The heat sink substrate 200 can also be a ceramic substrate with good heat dissipation performance.

Among them, the linear thermal expansion coefficient of the heat sink substrate 200 needs to be well matched with the linear thermal expansion coefficient of the epitaxial wafer material. If the heat generated during the operation of the semiconductor laser chip cannot be taken away in time, the temperature of the entire semiconductor laser chip will rise. Different expansion coefficients lead to different heating deformations, stress between the epitaxial wafer and the heat sink substrate, and causing the smile effect to occur, which damages the semiconductor laser chip and degrades the photoelectric characteristics of the semiconductor laser chip. If the stress is too large, it may even break the laser chip, causing the semiconductor laser chip to suddenly fail. Therefore, metal copper, graphene or ceramics are usually used as the heat sink substrate with a high thermal conductivity material approximately equivalent to the thermal expansion coefficient of the epitaxial wafer.

In a specific embodiment, a length of the heat sink substrate 200 in one direction is slightly greater than a length of the epitaxial wafer 100, and in the other direction, the length of the heat sink substrate 200 is slightly less than the length of the epitaxial wafer 100.

It can be understood that in other embodiments, the length and width of the heat sink substrate 200 are greater than the length and width of the epitaxial wafer 100; the specific length and width of the heat sink substrate 200 are selected according to the material of the epitaxial wafer and the subsequent process yield, which will not be repeated here.

In S13, the epitaxial wafer 100 is bonded to the first surface of the heat sink substrate 200 to form the first chip semi-finished product 10.

Figure 4:
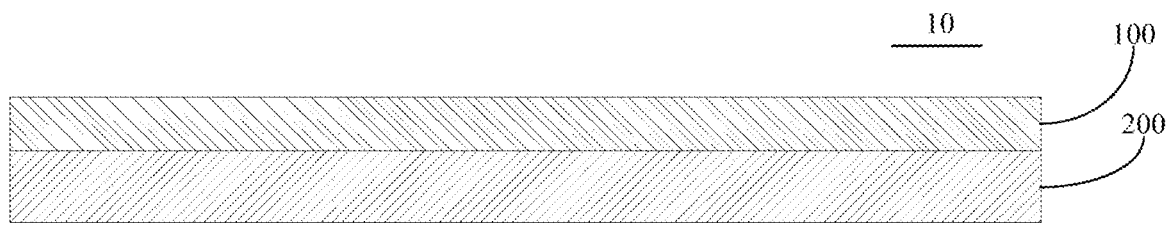
FIG. 4 is a schematic structural view of a first chip semi-finished product prepared in the present disclosure.

As shown in FIG. 4, the P surface of the epitaxial wafer 100 is bonded to the first surface of the heat sink substrate 200. Since the heat sink substrate 200 is a metal substrate, the heat sink substrate 200 can be used as a heat dissipation structure of the epitaxial wafer 100 on the one hand. At the same time, it can also be used as the P-side electrode of the semiconductor laser chip, that is, the anode.

Further, the N surface of the epitaxial wafer 100 can be thinned and polished to make the N surface of the epitaxial wafer 100 have relatively high flatness and smoothness, and at the same time, the N surface of the epitaxial wafer 100 is vapor-deposited and sputtered to form the N-side electrode, that is, the cathode. Specifically, the cathode can be patterned copper foil, or a gold wire.

In S14, a first division is performed on the first chip semi-finished product 10 in a direction perpendicular to the resonant cavities 110 from the second surface of the heat sink substrate, to divide the first chip semi-finished product 10 into a plurality of second chip semi-finished products 20.

Figure 5:
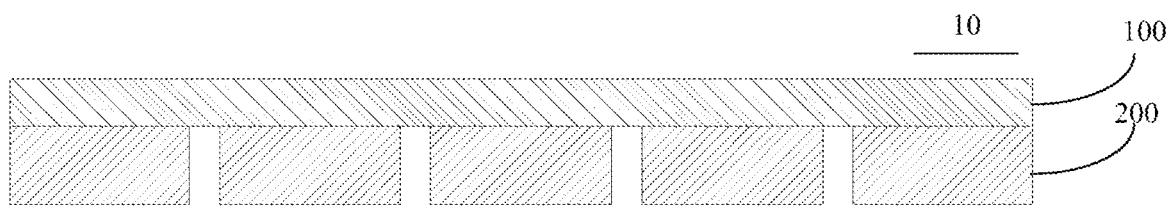
FIG. 5 is a schematic structural view of cutting of the first chip semi-finished product prepared in the present disclosure.
Figure 6:
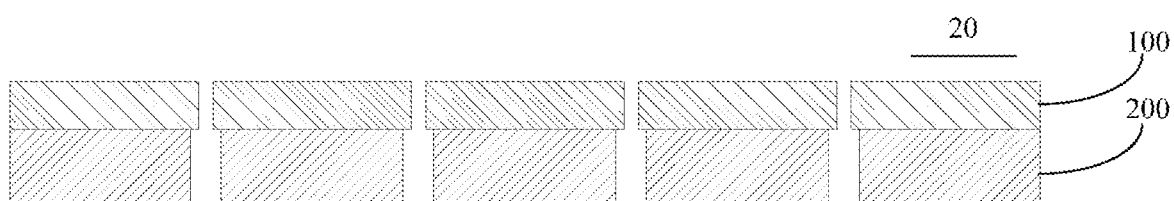
FIG. 6 is a schematic structural view of second chip semi-finished products prepared in the present disclosure.

As shown in FIG. 5 and FIG. 6, in a specific embodiment, the first chip semi-finished product 10 needs to be divided according to specific requirements, to obtain laser chips of desired models and sizes.

Please refer to FIG. 2. FIG. 2 is a specific embodiment of S14 of the preparation method for the semiconductor laser chip of the present disclosure, which specifically includes:

In S141, a first cutting is performed with a first width and a first depth on the first chip semi-finished product 10 from the second surface of the heat sink substrate in a direction perpendicular to the resonant cavities.

As shown in FIG. 5, after the first chip semi-finished product 10 is formed, the heat sink substrate 200 of the first chip semi-finished product 10 is cut from the second surface of the heat sink substrate 200 (i.e., the side of the heat sink substrate 200 facing away from the epitaxial wafer 100) along the direction perpendicular to resonant cavities. The cutting width is the first width, and the first width is less than 20 μm, specifically 19 μm, 18 μm, and so on. The cutting depth is the first depth, where the first depth is greater than or equal to the thickness of the heat sink substrate 200, that is, in a specific scenario, the cutting needs to stop at the layer of the epitaxial wafer 100, some errors before and after the cutting may be allowed. Preferably, it is exactly equal to the thickness of the heat sink substrate 200, that is, the surface of the epitaxial wafer 100 is exposed just after cutting.

In other embodiments, the thinning and polishing of the epitaxial wafer 100 can be processed after S141, which is not limited here.

After the first cutting is performed, a plurality of parallel first cutting slits will be formed on the first chip semi-finished product 10.

In S142, the first chip semi-finished product 10 is cleaved along the direction of the first cutting slits to form a plurality of second chip semi-finished products 20.

As shown in FIG. 5 and FIG. 6, obtaining the first chip semi-finished product 10 with the plurality of parallel cutting slits, a first cleavage is performed on the first chip semi-finished product 10 from the second surface along the direction of the first cutting slits. The cleavage direction of the first cleavage is the same as that of the first cutting, and the centerline of the first cleavage is basically coincident with the centerline of the first cutting slits. It can also be cleaved by assisting with a diamond knife, and the crystal lattice along the epitaxial wafer 100 can be separated relatively easily, and a flat and smooth cleavage surface can be produced. Dry etching or wet etching can also be used to assist cleaving, and combined with other treatments can be used to produce a flat and smooth cavity surface.

In a modified embodiment, the first cleavage can also be performed from a third surface along the direction of the first cutting slits.

Specifically, the width of the first cleavage is the second width, and the depth of the first cleavage is the second depth, where the second width is less than the first width, and the depth is greater than or equal to the thickness of the epitaxial wafer 100.

Figure 7:
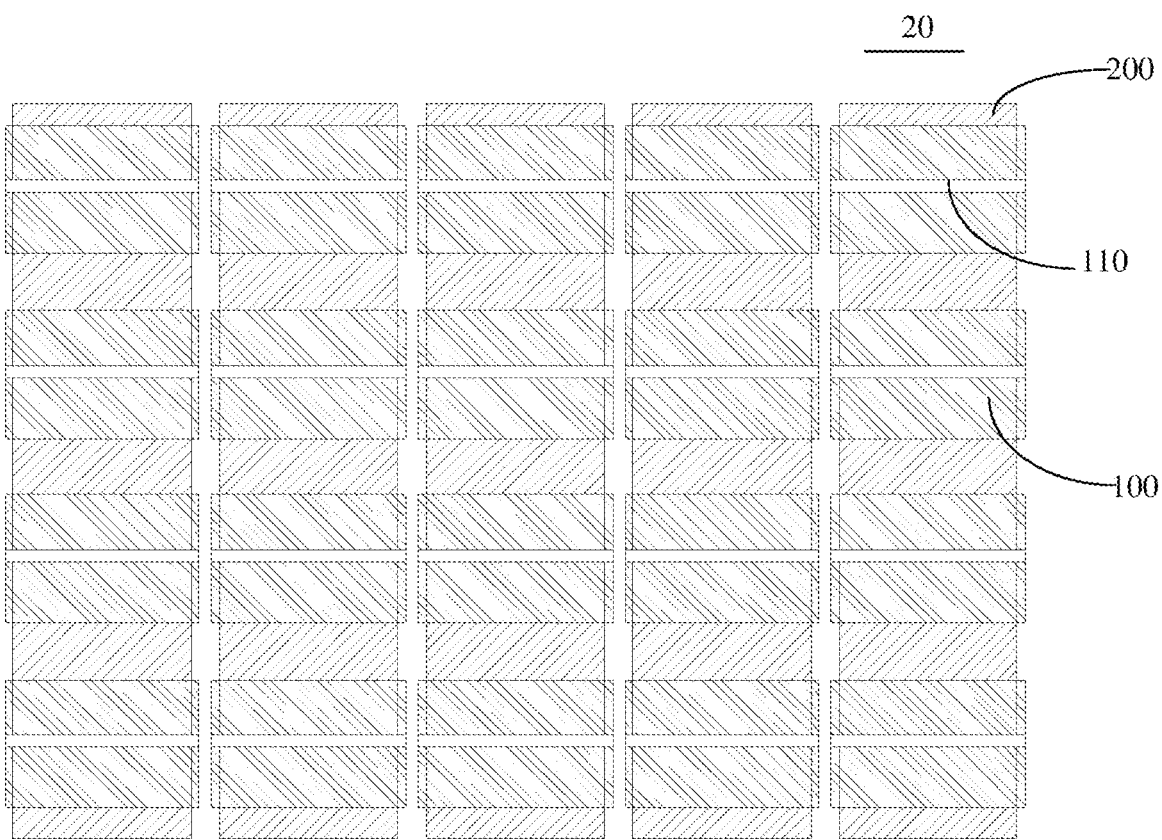
FIG. 7 is a structural schematic view of a second division on the second chip semi-finished products prepared in the present disclosure.

As shown in FIG. 7, since the second width is less than the first width, the length of the epitaxial wafer 100 of the second chip semi-finished products 20 formed in the direction parallel to the resonant cavities 110 is greater than the length of the heat sink substrate 200. The advantage is to reduce the shadow effect during the subsequent coating of the cavity surface of the resonant cavities, which is beneficial to improve the uniformity of the coating on the front and back cavity surfaces of the resonant cavities.

Further coating the cleavage plane (splitting plane) in the cavity direction of each second chip semi-finished product 20, including coating the front cavity surface (light emitting surface) with an antireflection film, and coating the back cavity surface (rear surface) with a reflective film, etc. to form a resonant cavity that proliferates stimulated radiation photons. It can be understood that the resonant cavity coating can be performed after the second chip semi-finished products 20 are formed, or in other steps after the cleavage planes are formed in the present disclosure.

In S15, a second division of the second chip semi-finished products 20 is performed in a direction parallel to the resonant cavities 110 to divide the second chip semi-finished product 20 into a plurality of semiconductor laser chips 30, so that each of the semiconductor laser chips 30 includes at least one laser bar.

Figure 8:
FIG. 8 is a structural schematic view of semiconductor laser chips prepared in the present disclosure.

As shown in FIG. 7 and FIG. 8, after the second chip semi-finished products 20 are obtained, the second chip semi-finished products 20 are further divided according to actual needs. The second division can be performed on multiple second chip semi-finished products 20 or a single second chip semi-finished product 20.

Figure 3:
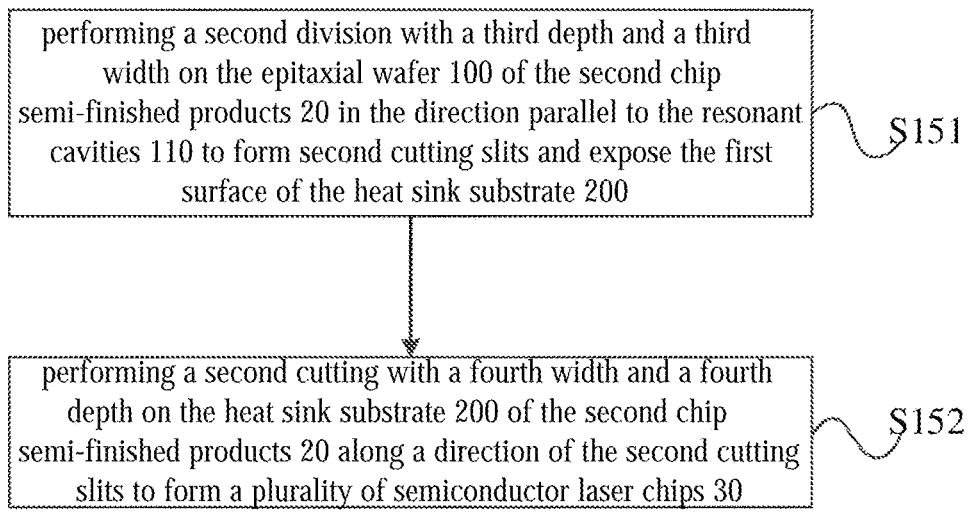
FIG. 3 is a specific schematic flowchart of S15 of the preparation method for the semiconductor laser chip according to the present disclosure.

Please refer to FIG. 3. FIG. 3 is a schematic flow chart of S15 of the preparation method for the semiconductor laser chip according to a specific embodiment of the present disclosure, and it is specifically the sub-step of S15 in FIG. 1, which specifically includes:

In S151, the second division of the epitaxial wafer 100 of the second chip semi-finished products 20 is performed with a third width and a third depth along the direction parallel to the resonant cavities 110 to form second cutting slits, and the second division stops at and exposes the first surface of the heat sink substrate 200.

As shown in FIG. 7, the second division with the third width and the third depth along the direction parallel to the resonant cavities 110 is performed on the epitaxial wafer 100 of the second chip semi-finished products 20 to form second cutting slits. The cutting direction is perpendicular to the direction of the first cutting. The cutting line is parallel to the resonant cavities, and the center line of each of the cutting slits coincides with the center line of the adjacent two resonant cavities.

Specifically, the cutting width of the second cutting slits is the third width, the cutting depth of the second cutting slits is the third depth, the third width of the second cutting slits is less than the distance between two adjacent resonant cavities, and the third depth of the second cutting slits is equal to or greater than the thickness of the epitaxial wafer 100, thereby forming at least one second cutting slit with the third depth and the third width, and since the cutting has stopped at the heat sink substrate 200, the first surface of the heat sink substrate 200 is exposed.

At this time, a plurality of laser bars is formed on the surface of the heat sink substrate 200 of each of the second chip semi-finished products 20, and each laser bar includes one resonant cavity 110. That is, the epitaxial wafer 100 has been cut into a plurality of laser bars containing the resonant cavity 110. Further coating the cleavage plane (splitting plane) in the cavity direction of each second chip semi-finished product 20, including coating the front cavity surface (light emitting surface) with an antireflection film, and coating the back cavity surface (rear surface) with a reflective film, etc. to form a resonant cavity that proliferates stimulated radiation photons.

In S152, a cutting with a fourth width and a fourth depth is performed on the heat sink substrate 200 of the second chip semi-finished products 20 along the second cutting slits direction to form a plurality of semiconductor laser chips 30.

As shown in FIG. 8, after the second chip semi-finished products 20 with the second cutting slits are obtained, the second chip semi-finished products 20 are cut. Specifically, the second chip semi-finished products 20 may be cleaved or cut with the fourth width and the fourth width along the second cutting slits. Similar to the above, the fourth cutting width is less than the third cutting width, and the fourth depth is greater than or equal to the thickness of the heat sink substrate 200.

It can be understood that when performing specific cutting, the cutting can be performed according to actual specifications, so as to obtain the semiconductor laser chips 30 of required models, so that the obtained semiconductor laser chips 30 includes the required number of laser bars and the like. Specifically, some semiconductor laser chips 30 include one laser bar, and some semiconductor laser chips include multiple laser bars. Compared with the multi-laser bar semiconductor laser chips formed by one-bar-one-bar bonding in the prior art, the preparation of the multi-laser bar semiconductor laser chips can be completed through the improvement of the cutting process of the epitaxial wafer, which saves the welding process and further improves the production efficiency.

The above-mentioned cutting can use photolithography, laser cutting, water jet, or etching, or other conventional process means.

Moreover, the above relates to the cutting depth of the epitaxial wafer 100, that is, the second depth and the third depth are determined according to specific operations. For example, after the epitaxial wafer 100 is thinned in advance, the depth is the current thickness of the epitaxial wafer 100, that is, the thickness after thinning.

Figure 9:
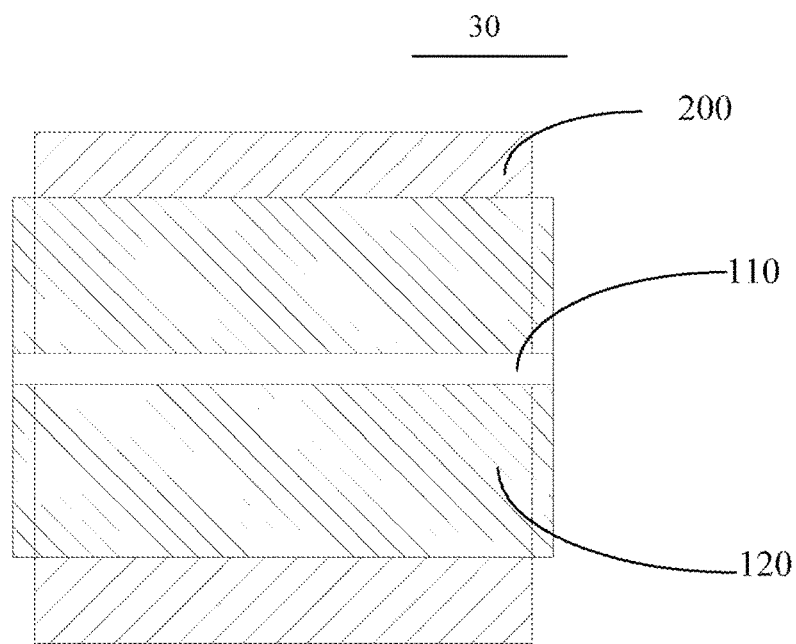
FIG. 9 is a structural schematic view of the semiconductor laser chip provided by the present disclosure.

Please refer to FIG. 9. FIG. 9 is a structural schematic diagram of the semiconductor laser chip provided by the present disclosure, that is, a structural schematic diagram of the semiconductor laser chip 30 prepared by the above process, which includes the heat sink substrate 200 and the laser bar 120 arranged on the heat sink substrate 200, wherein the laser bar 120 includes the resonant cavity 110.

As shown in FIG. 9, in the direction of the resonant cavity 110, the length of the heat sink substrate 200 is less than the length of the laser bar, so that the laser bar protrudes slightly from the heat sink substrate 200. The advantage of this design is that the subsequent stacked bars coating process, the shadow effect of the coating caused by the shielding of the heat sink substrate can be reduced, which is beneficial to improve the coating uniformity of the front and back cavity surfaces of the resonant cavity, thereby improving the stability and service life of the laser.

In the length perpendicular to the direction of the resonant cavity 110, the length of the heat sink substrate 200 is greater than the length of the laser bar, which makes the area of the heat sink substrate 200 relatively large, thereby increasing the entire heat dissipation area and enhancing the heat dissipation effect.

In summary, the present disclosure provides a preparation method for a semiconductor laser chip. Through the improvement of the cutting process of the epitaxial wafer and the heat sink substrate, the preparation of the semiconductor laser chip including a plurality of laser bars is formed, which saves the process and further improves production efficiency. In addition, the semiconductor laser chip of the present disclosure can simultaneously complete the preparation of the multi-laser bar semiconductor laser chip. Compared with the existing multi-laser bar semiconductor laser chip process, the problem of post-fixing that affects the connectivity of the previously fixed laser bar will not occur, thereby enhancing the quality and life of the entire semiconductor laser chip.

The above are only embodiments of the present disclosure, and do not limit the scope of the present disclosure. Any equivalent results or equivalent process transformations made using the contents of the description and drawings of the present disclosure, or directly or indirectly applied to other related technical fields, shall fall within the scope of protection of the present disclosure.

What is claimed is:

1. A preparation method for a semiconductor laser chip, comprising the following steps:
    S11: providing an epitaxial wafer, the epitaxial wafer comprising a plurality of resonant cavities arranged in parallel;
    S12: providing a heat sink substrate comprising a first surface and a second surface that are oppositely disposed;
    S13: bonding the epitaxial wafer to the first surface of the heat sink substrate to form a first chip semi-finished product;
    S14: performing a first division on the first chip semi-finished product in a direction perpendicular to the resonant cavities, to divide the first chip semi-finished product into a plurality of second chip semi-finished products;
    S15: performing a second division on the second chip semi-finished products in a direction parallel to the resonant cavities to divide the second chip semi-finished products into a plurality of semiconductor laser chips, so that each of the semiconductor laser chips comprises a portion of the heat sink substrate and at least one laser bar bonded to the portion of the heat sink substrate;
    wherein the step S14 comprises performing a first cutting on the heat sink substrate of the first chip semi-finished product in the direction perpendicular to the resonance cavities to form first cutting slits, and a depth of each of the first cutting slits is greater than or equal to a thickness of the heat sink substrate.

2. The preparation method of claim 1, wherein the step S14 further comprises:
    performing a first cleavage on the epitaxial wafer of the first chip semi-finished product along a direction of the first cutting slits to form a plurality of cleavage planes of the second chip semi-finished products.

3. The preparation method of claim 2, wherein the step S14 comprises coating the cleavage planes of the second chip semi-finished products to form resonant cavities, wherein an antireflection film which allows some outcoupling is coated on front cavity surfaces of the resonant cavities, and a reflective film is coated on back cavity surfaces of the resonant cavities.

4. The preparation method of claim 1, wherein the step S15 comprises:
    performing the second division on the epitaxial wafer of the second chip semi-finished products in the direction parallel to the resonant cavities to form second cutting slits.

5. The preparation method of claim 4, wherein the step S15 comprises:
    cutting the heat sink substrate of the second chip semi-finished products along a direction of the second cutting slits to form the plurality of semiconductor laser chips.

6. The preparation method of claim 4, wherein a depth of each of the second cutting slits is greater than or equal to a thickness of the epitaxial wafer, and a width of each of the second cutting slits is less than 20 µm.

7. The preparation method of claim 1, wherein the step S15 comprises: coating cavity surfaces of the resonant cavities of the second chip semi-finished products to form resonant cavities, wherein an antireflection film which allows some outcoupling is coated on front cavity surfaces of the resonant cavities, and a reflective film is coated on back cavity surfaces of the resonant cavities.

8. The preparation method of claim 1, wherein the step S13 comprises thinning and polishing a side of the epitaxial wafer away from the heat sink substrate.

9. The preparation method of claim 1, wherein the heat sink substrate is one of metal substrate, ceramic substrate, or sapphire substrate.

* * * * *